(12) United States Patent
Zhang et al.

(10) Patent No.: US 12,439,520 B2
(45) Date of Patent: Oct. 7, 2025

(54) CIRCUIT BOARD WITH EMBEDDED RESISTORS AND METHOD FOR FABRICATING THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei (TW)

(72) Inventors: Xiao-Juan Zhang, Hebei Province (CN); Gang Yuan, Hebei Province (CN)

(73) Assignees: HONGQISHENG PRECISION ELECTRONICS (QINHUANGDAO) CO., LTD., Hebei Province (CN); AVARY HOLDING (SHENZHEN) CO., LTD., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 245 days.

(21) Appl. No.: 18/458,566

(22) Filed: Aug. 30, 2023

(65) Prior Publication Data
US 2025/0056725 A1 Feb. 13, 2025

(30) Foreign Application Priority Data
Aug. 9, 2023 (CN) .......................... 202310998786.X (51) Int. Cl.
*H05K 1/16* (2006.01)
*H05K 3/42* (2006.01)
(52) U.S. Cl.
CPC ............. *H05K 1/167* (2013.01); *H05K 3/423* (2013.01); *H05K 2201/09509* (2013.01); *H05K 2203/128* (2013.01)

(58) Field of Classification Search
CPC ................... H05K 1/167; H05K 3/423; H05K 2201/10196; H05K 2201/09509; H01C 10/06; H01C 10/08; H01C 10/02
See application file for complete search history.

(56) References Cited

U.S. PATENT DOCUMENTS

2023/0012885 A1   1/2023  Nagels et al.

FOREIGN PATENT DOCUMENTS

| JP | 1996236179 A | 2/1995 |
| TW | 202040136 A | 11/2020 |

OTHER PUBLICATIONS

H. Wang et al., " PLUS-Material: Porous Liquid-metal enabled Ubiquitous Soft Material". Materials Horizons, Dec. 19, 2017, 12 pages, DOI:10.1039/C7MH00989E.

*Primary Examiner* — Jeremy C Norris
(74) *Attorney, Agent, or Firm* — MUNCY, GEISSLER, OLDS & LOWE, P.C.

(57) ABSTRACT

A circuit board with embedded resistors and a method for fabricating the same are provided. The circuit board includes the circuit substrate and the variable resistor region. The variable resistor region includes the first resistor layer, the second resistor layer and the liquid metal material. The first resistor layer is electrically connected to the circuit substrate, and the second resistor layer overlaps the first resistor layer. The liquid metal material is located on and is electrically connected to the first resistor layer. The liquid metal material is spaced from the second resistor layer without any electrical connection under the initial temperature. The liquid metal material is electrically connected to the second resistor layer under the first temperature which is higher than the initial temperature.

15 Claims, 8 Drawing Sheets

CIRCUIT BOARD WITH EMBEDDED RESISTORS AND METHOD FOR FABRICATING THE SAME

RELATED APPLICATIONS

This application claims priority to China Application Serial Number 202310998786.X, filed Aug. 9, 2023, which is herein incorporated by reference in its entirety.

BACKGROUND

Technical Field

The advantage of the circuit board with embedded resistors is that the signal transmission paths are shorten, thereby reducing the effect of outside signal and increasing the signal transmission speed. Moreover, the routing density of the circuit board can be increased, which is beneficial to reduce the area of the circuit board, so as to provide a lighter or thinner electronic component. In general, the resistances of the embedded resistors are adjusted by varying the length or width of the embedded resistors. Thus, the resistances of the embedded resistors which have been already disposed in a circuit board are not adjustable, so that the application of the circuit board is limited.

Description of Related Art

In present, wireless communication has been developed rapidly, and the requirements for transmission speed and terminal network density are gradually increasing. Accordingly, wireless communication antenna technology of Multiple-Input Multiple-Output (MIMO) has been developed. Although present electromagnetic shielding technology can fulfill the usage of transmission signals in a specific frequency range, the antennas and transmission wires are increasingly affected by external signals as the demand for high-frequency transmission increases. For example, the antennas and transmission wires are prone to be affected when the signal frequency exceeds 50 GHz.

SUMMARY

Accordingly, the disclosure is to provide a circuit board with embedded resistors and the method for fabrication of the same. The embedded resistors are variable, thereby broadening the application of the circuit board with embedded resistors.

At least one embodiment of the disclosure provides a circuit board including a circuit substrate and a variable resistive region. The variable resistive region is located in the circuit substrate, and the variable resistive region includes a first resistive layer electrically connected to the circuit substrate, a second resistive layer located on and overlapping the first resistive layer and a liquid metal material distributed on and electrically connected to the first resistive layer. When the liquid metal material is under an initial temperature, the liquid metal material is spaced from the second resistive layer, and the liquid metal material is not electrically connected to the second resistive layer. When the liquid metal material is under a first temperature higher than the initial temperature, the liquid metal material touches the second resistive layer, and the liquid metal material is electrically connected to the second resistive layer.

At least in one embodiment of the disclosure, the second resistive layer further includes a hole connecting two opposite sides of the second resistive layer. When the liquid metal material is under the first temperature, the liquid metal material extends to the hole and is connected to the second resistive layer through a side wall of the hole.

At least in one embodiment of the disclosure, the variable resistive region further includes a third resistive layer overlapping the second resistive layer. The second resistive layer is located between the first resistive layer and the third resistive layer. When the liquid metal material is under a second temperature higher than the first temperature, the liquid metal material extends to and is electrically connected to the third resistive layer through the hole.

At least in one embodiment of the disclosure, the circuit substrate includes three circuit layers. The circuit layers are separately located on the first resistive layer, the second resistive layer and the third resistive layer. The circuit substrate includes a pad layer. Two of the circuit layers are located between the pad layer and the other one of the circuit layers. The circuit substrate includes a plurality of conductive blind vias disposed between two adjacent circuit layers and disposed between one of the circuit layers and the pad layer. The circuit layers and the pad layer are electrically connected to each other through the plurality of conductive blind vias.

At least in one embodiment of the disclosure, the circuit substrate further includes an insulation material located between the second resistive layer and the third resistive layer. The insulation material includes an opening, and the opening connects the hole with the third resistive layer.

At least in one embodiment of the disclosure, when the liquid metal material is under the first temperature, a liquid surface of the liquid metal material is located between two opposite ends of the opening and is spaced from the third resistive layer.

At least in one embodiment of the disclosure, the liquid metal material includes gallium-base alloy.

At least in one embodiment of the disclosure, the circuit board further includes a protecting layer located in the hole of the second resistive layer and covering an inner wall of the hole. The second resistive layer is electrically connected to the protecting layer.

At least in one embodiment of the disclosure, a resistance of the first resistive layer is larger than a resistance of the second resistive layer.

At least in one embodiment of the disclosure, the circuit board further includes two covering layers separately disposed on two opposite sides of the circuit substrate and covering the variable resistive region.

At least one embodiment of the disclosure provides a method for fabricating a circuit board. The method includes providing a first substrate. The first substrate is patterned to form a first resistive layer. A second substrate is disposed on the first substrate. The second substrate is patterned to form a second resistive layer. A part of the first substrate and a part of the second substrate is removed to form a trench. The trench connects the first resistive layer with the second resistive layer. A liquid metal material is disposed, and the liquid metal material is electrically connected to the first resistive layer.

According to the aforementioned embodiments, the electrical connection between each resistive layer of the variable resistive region can be adjusted through the volume change of the liquid metal material under different temperatures. Thus, the resistance of the circuit board is can be adjusted. Therefore, the circuit board with embedded resistors is equipped with the function of varying resistances, thereby broadening the application of the circuit board with embedded resistors.

BRIEF DESCRIPTION OF THE DRAWINGS

To illustrate more clearly the aforementioned and the other features, merits, and embodiments of the present disclosure, the description of the accompanying figures are as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, the dimensions (such as lengths, widths and thicknesses) of components (such as layers, films, substrates and regions) in the drawings are enlarged not-to-scale, and the number of components may be reduced in order to clarify the technical features of the disclosure. Therefore, the following illustrations and explanations are not limited to the number of components, the number of components, the dimensions and the shapes of components, and the deviation of size and shape caused by the practical procedures or tolerances are included. For example, a flat surface shown in drawings may have rough and/or non-linear features, while angles shown in drawings may be circular. As a result, the drawings of components shown in the disclosure are mainly for illustration and not intended to accurately depict the real shapes of the components, nor are intended to limit the scope of the claimed content of the disclosure.

Further, when a number or a range of numbers is described with "about," "approximate," "substantially," and the like, the term is intended to encompass numbers that are within a reasonable range considering variations that inherently arise during manufacturing as understood by one of ordinary skill in the art. In addition, the number or range of numbers encompasses a reasonable range including the number described, such as within +/−30%, +/−20%, +/−10% or +/−5% of the number described, based on known manufacturing tolerances associated with manufacturing a feature having a characteristic associated with the number. The words of deviations such as "about," "approximate," "substantially," and the like are chosen in accordance with the optical properties, etching properties, mechanical properties or other properties. The words of deviations used in the optical properties, etching properties, mechanical properties or other properties are not chosen with a single standard.

Figure 1A:
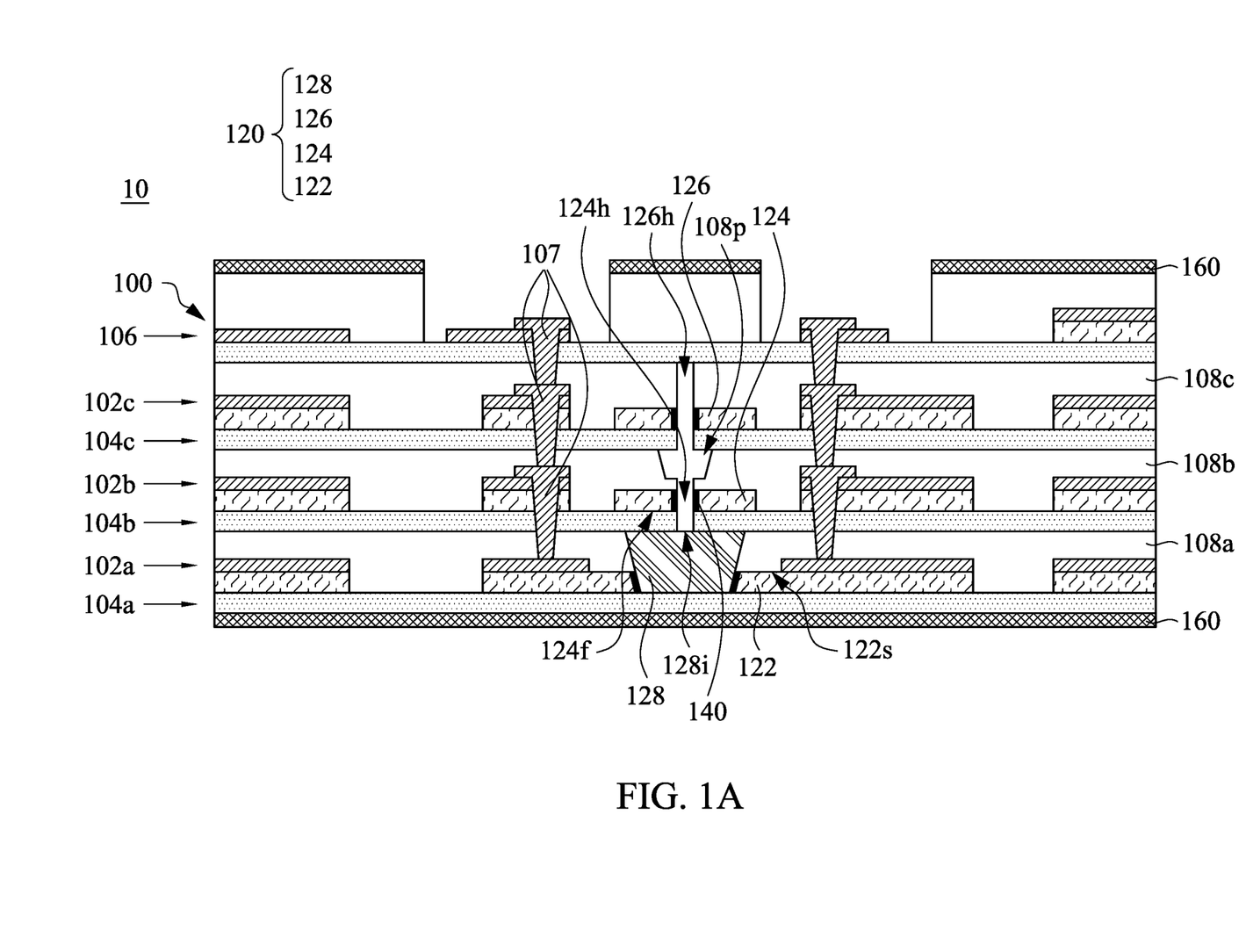
FIG. 1A to FIG. 1C illustrate cross-sectional views of a circuit board under different temperatures in accordance with one embodiment of the present disclosure.

A circuit board is disclosed. Referring to FIG. 1A, the circuit board 10 includes the circuit substrate 100 and the variable resistive region 120, while the variable resistive region 120 is located within the circuit substrate 100. In the embodiment, the variable resistive region 120 includes the first resistive layer 122, the second resistive layer 124, the third resistive layer 126 and the liquid metal material 128. The circuit substrate 100 includes the circuit layer 102a, the circuit layer 102b and the circuit layer 102c, and the circuit layer 102a, circuit layer 102b and the circuit layer 102c are separately located on the first resistive layer 122, the second resistive layer 124 and the third resistive layer 126.

In addition, the circuit substrate 100 further includes the insulation layer 104a, the insulation layer 104b and the insulation layer 104c, while one circuit layer and one insulation layer are separately located on two opposite sides of one resistive layer. Specifically, the circuit layer 102a and the insulation layer 104a are separately located on two opposite sides of the first resistive layer 122; the circuit layer 102b and the insulation layer 104b are separately located on two opposite sides of the second resistive layer 124; and the circuit layer 102c and the insulation layer 104c are separately located on two opposite sides of the third resistive layer 126.

In the embodiment, the circuit substrate 100 further includes the pad layer 106, and the circuit layer 102b and the circuit layer 102c are located between the pad layer 106 and the circuit layer 102a. In other words, the pad layer 106 and the circuit layer 102a are separately located on two opposite sides of the circuit substrate 100, while the other circuit layers are located between the pad layer 106 and the circuit layer 102a. On the other hand, the circuit substrate 100 further includes the plurality of conductive blind vias 107 which are disposed between two adjacent circuit layers. For instance, some of the plurality of conductive blind vias 107 are disposed between the circuit layer 102a and the circuit layer 102b, while some of the plurality of conductive blind vias 107 are disposed between the circuit layer 102b and the circuit layer 102c. In addition, some of the plurality of conductive blind vias 107 are disposed between the circuit layer 102c and the pad layer 106.

It is worth mentioning, since the circuit layer 102a directly touches the first resistive layer 122, and the circuit layer 102a, the circuit layer 102b, the circuit layer 102c and the pad layer 106 are electrically connected to each other through the plurality of conductive blind vias 107, the first resistive layer 122 is electrically connected to the circuit layer 102a, the circuit layer 102b, the circuit layer 102c and the pad layer 106 of the circuit substrate 100.

As shown in FIG. 1A, the second resistive layer 124 is located on and overlaps the first resistive layer 122. Furthermore, the third resistive layer 126 overlaps the second resistive layer 124, and the second resistive layer 124 is located between the first resistive layer 122 and the third resistive layer 126. On the other hand, the circuit substrate 100 further includes the insulation material 108a, the insulation material 108b and the insulation material 108c. The insulation material 108a is located between the first resistive layer 122 and the second resistive layer 124; the insulation material 108b is located between the second resistive layer 124 and the third resistive layer 126; and the insulation material 108c is located between the third resistive layer 126 and the pad layer 106.

The liquid metal material 128 of the variable resistive region 120 is distributed on the first resistive layer 122. As shown in 1, the liquid metal material 128 are disposed within the insulation material 108a, and two ends of the liquid metal material 128 are separately connected to the insulation layer 104a and the insulation layer 104b. It is worth mentioning, the liquid metal material 128 is electrically connected to the first resistive layer 122. The liquid metal material 128 may be a gallium-base alloy including at least one element from gallium, indium, tin, zinc, bismuth, antimony, lead, lanthanum, cerium and neodymium or metal alloy which is liquid under room temperature (e.g. gallium-indium-tin alloy). This material has low melting point and is in liquid stated under room temperature.

In this embodiment, the volume expansivity of the liquid metal material 128 ranges from 3% to 5%, but the disclosure is not limited to the embodiments. In various embodiments of the disclosure, the volume expansivity of the liquid metal material 128 depends on the dimension of the variable resistive region 120, so that the electrical connection inside the variable resistive region 120 is able to achieve under specific temperature. Thus, the volume expansivity of the liquid metal material 128 may be selected according the dimension of the variable resistive region 120.

In the embodiment, the second resistive layer 124 may further include the hole 124h which connects two opposite sides of the second resistive layer 124. It is worth mentioning, the hole 124h may pass through the insulation layer 104b and extend to the liquid metal material 128, so that the liquid metal material 128 is connected to one side of the second resistive layer 124 which backs up to the liquid metal material 128. In other words, the hole 124h passes through the second resistive layer 124 and the insulation layer 104b, and then stops at the liquid surface 128i of the liquid metal material 128. On the other hand, the third resistive layer 126 further includes the hole 126h which connects two opposite sides of the third resistive layer 126. It is worth mentioning, the hole 126h may further extend to the insulation material 108c in this embodiment.

Moreover, in the embodiment, the insulation material 108b includes opening 108p which connects the hole 124h with the hole 126h of the third resistive layer 126. Specifically, the opening 108p may further pass through the insulation layer 104c and extend toward the surface 126s of the third resistive layer 126, so that two opposite sides of the third resistive layer 126 are connected to each other.

Figure 1B:
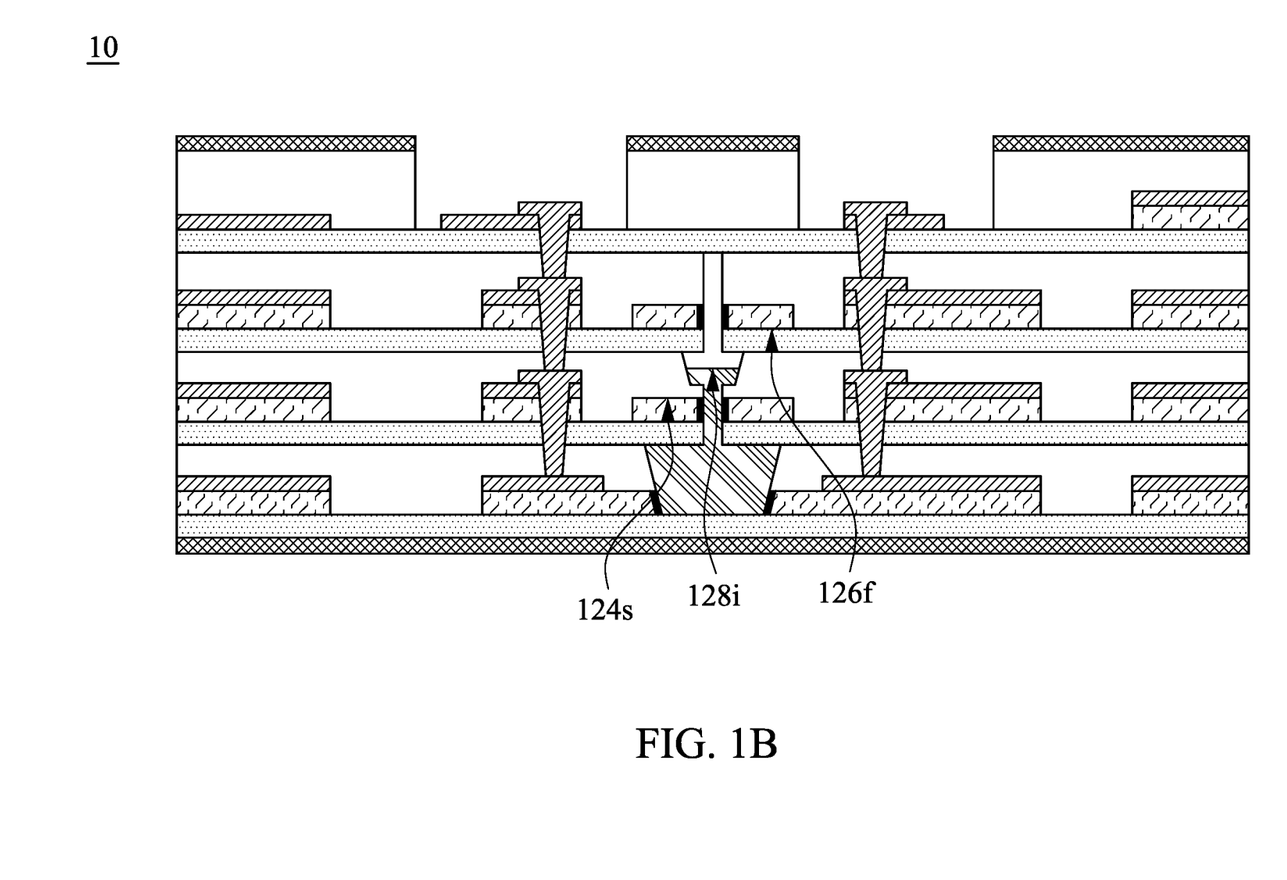
Figure 1C:
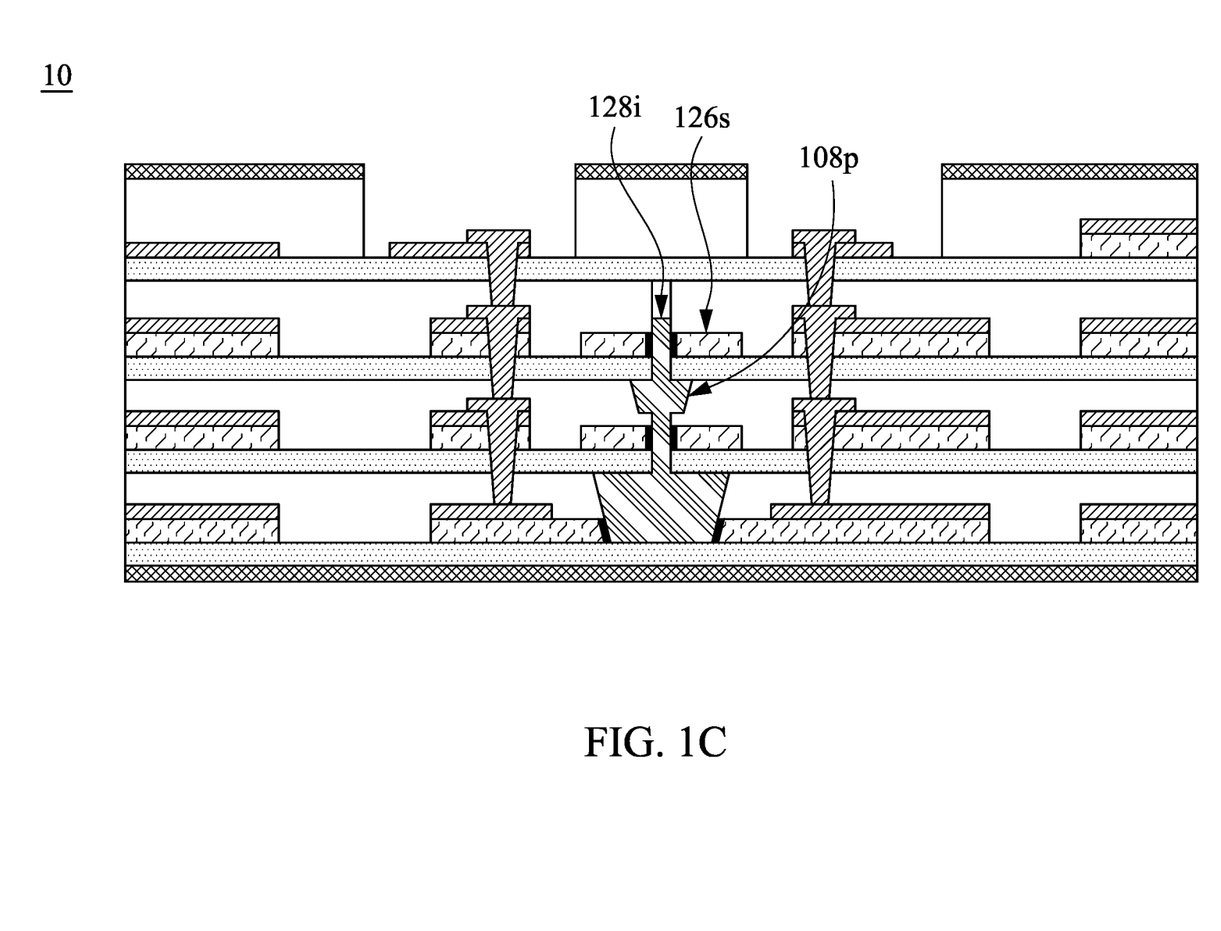

FIG. 1A to FIG. 1C illustrate the cross-sectional views of the circuit board 10 under different temperatures. Referring to FIG. 1A, when the liquid metal material 128 is under the initial temperature T0, the liquid metal material 128 is spaced from the second resistive layer 124. Specifically, under the initial temperature T0, the liquid surface 128i of the liquid metal material 128 is located between the surface 122s of the first resistive layer 122 and the surface 124f of the second resistive layer 124 without aligning to the surface 124f. As a result, the liquid surface 128i of the liquid metal material 128 does not touch the second resistive layer 124, and thus the liquid metal material 128 is not electrically connected to the second resistive layer 124.

Referring to FIG. 1B, when the liquid metal material 128 is under the first temperature T1 which is higher than the initial temperature T0, the volume of the liquid metal material 128 expands as temperature rises, and thus the liquid metal material 128 extends to the hole 124h of the second resistive layer 124.

Specifically, the liquid surface 128i of the liquid metal material 128 shifts up to the level between the surface 124s of the second resistive layer 124 and the surface 126f of the third resistive layer 126. The part of the liquid metal material 128 which passes through the hole 124h touches the inner wall (not denoted) of the hole 124h, and the liquid metal material 128 is electrically connected to the second resistive layer 124 through this inner wall. It should be noted that the liquid surface 128i of the liquid metal material 128 is located between two opposite sides of the opening 108p and is spaced from the third resistive layer 126. Thus, the liquid metal material 128 is not electrically connected to the third resistive layer 126.

It is worth mentioning, in the embodiment, the circuit board 10 further includes the protecting layer 140 which is located in the hole 124h of the second resistive layer 124 and covers the inner wall of the hole 124h. Since the protecting layer 140 may include metal materials such as nickel, gold of the similarity thereof, the second resistive layer 124 may be electrically connected to the protecting layer 140. Accordingly, the liquid metal material 128 inside the hole 124h may be electrically connected to the second resistive layer 124 through the protecting layer 140.

Referring to FIG. 1C, when the liquid metal material 128 is under the second temperature T2 which is higher than the first temperature T1, the volume of the liquid metal material 128 expands as temperature rises, and thus the liquid metal material 128 extends to the third resistive layer 126 through the hole 124h of the second resistive layer 124. Specifically, when the initial temperature T0 rises up to the second temperature T2, the volume of the liquid metal material 128 expands and passes through the hole 124h of the second resistive layer 124, the opening 108p of the insulation material 108b and the hole 126h of the third resistive layer 126 sequentially, and thus the liquid surface 128i of the liquid metal material 128 protrudes the surface 126s of the third resistive layer 126. The part of the liquid metal material 128 which passes through the hole 126h touches the inner wall (not denoted) of the hole 126h, and the liquid metal material 128 is electrically connected to the third resistive layer 126 through this inner wall.

When the circuit board 10 is energized under the initial temperature T0, the current passes through the first resistive layer 122 and generates the resistance R0 since only the first resistive layer 122 is electrically connected to the circuit substrate 100. When the circuit board 10 is energized under the first temperature T1, the liquid metal material 128 expands and is electrically connected to the first resistive layer 122 and the second resistive layer 124. Accordingly, the current passes through the first resistive layer 122 and the second resistive layer 124 and generates the resistance R1.

In the embodiment, the resistance r1 of the first resistive layer 122 is larger than the resistance r2 of the second resistive layer 124, while the first resistive layer 122 and the second resistive layer 124 are electrically connected to each other in parallel. For instance, the resistance R1 which is generated by the parallel connection of the first resistive layer 122 and the second resistive layer 124 (i.e. under the first temperature T1) is calculated as following equation:

R1=1/(1/r1+1/r2). Thus, the result that the resistance R1 under the first temperature T1 is smaller than the resistance R0 under the initial temperature T0 of the circuit board 10 is inferred.

However, the resistance of the resistive layers of the disclosure is not limited to the aforementioned embodiment. In other embodiments, the resistance r1 of the first resistive layer 122 may be smaller than the resistance r2 of the second resistive layer 124.

When the circuit board 10 is energized under the second temperature T2, the liquid metal material 128 expands and is electrically connected to the first resistive layer 122, the second resistive layer 124 and the third resistive layer 126. As a result, the current passes through the first resistive layer 122, the second resistive layer 124 and the third resistive layer 126 and generates the resistance R2. According to the aforementioned embodiment, the resistance r1 of the first resistive layer 122 is larger than the resistance r2 of the second resistive layer 124, and the resistance r2 of the second resistive layer 124 is larger than the resistance r3 of the third resistive layer 126, while these three resistive layers are electrically connected to each other in parallel. The resistance R2 which is generated by the parallel connection of three resistive layers is calculated as following equation: R2=1/(1/r1+1/r2+1/r3). Thus, the result that the resistance R2 under the second temperature T2 is smaller than the resistance R1 under the first temperature T1 and also smaller than the resistance R0 under the initial temperature T0 of the circuit board 10 is inferred.

It is worth mentioning, the diameters of the hole 124h and the hole 126h range from 20 μm to 100 μm. In the embodiment, the width of the opening 108p may be larger than the diameters of the hole 124h and the hole 126h, so that a part of the liquid metal material 128 may be temporary stored within the opening 108p as a buffer region to stabilize the resistance during the expansion or the shrinkage. Specifically, the liquid metal material 128 should expand to specific volume which is larger than this buffer region, so that the first resistive layer 122 is allowed to be electrically connected to the second resistive layer 124. That is, the change of the temperature should be large enough before the resistance varies.

The circuit board 10 further includes two covering layers 160 separately located on two opposite sides of the circuit substrate 100 and covering the variable resistive region 120. Furthermore, the covering layer 160 exposes the plurality of pads (not denoted) which are located on the pad layer 106. The covering layers 160 may include insulation materials such as resin.

Figure 2A:
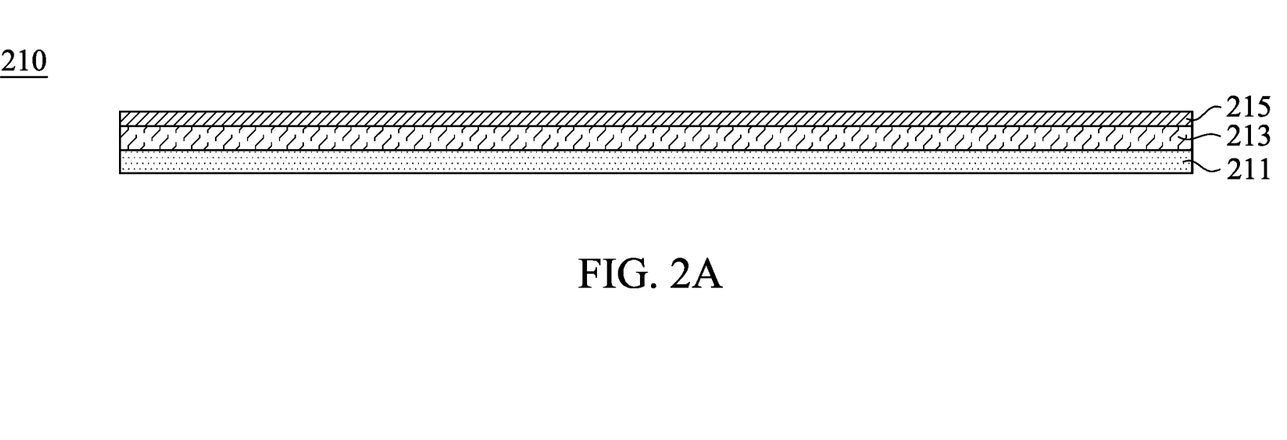
FIG. 2A to FIG. 2H illustrate cross-sectional views of a method for fabricating a circuit board in accordance with one embodiment of the present disclosure.
Figure 2B:
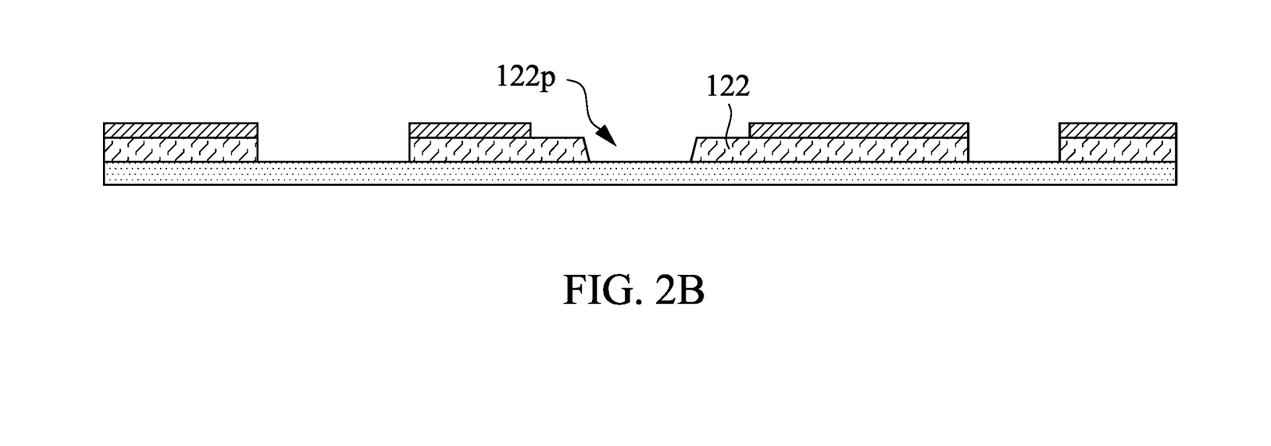
Figure 2C:
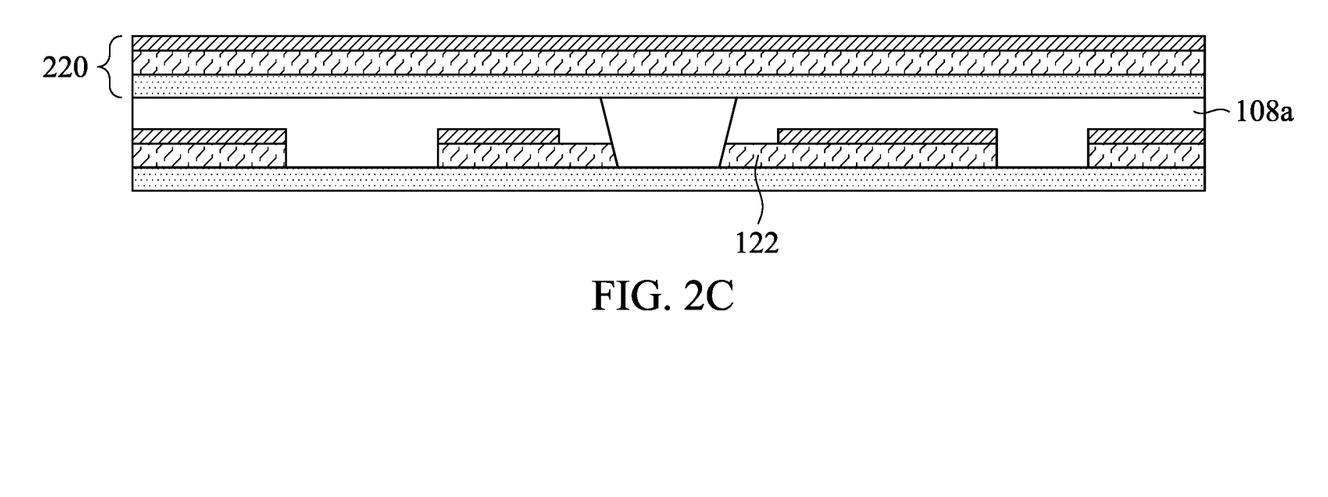

FIG. 2A to FIG. 2H illustrate cross-sectional views of a method for fabricating the circuit board 10 of FIG. 1A. As shown in FIG. 2A and FIG. 2B, firstly, the first substrate 210 is provided, and the first substrate 210 is patterned to form the first resistive layer 122 by lithography and etching (e.g. etching by copper sulfate or alkaline solutions). The first resistive layer 122 includes the opening 122p which may be formed by ablative laser or similarity thereof. Afterwards, as shown in FIG. 2C, the insulation material 108a is formed on the first resistive layer 122, and the insulation material 108a exposes the opening 122p of the first resistive layer 122. Afterwards, the second substrate 220 is disposed on the insulation material 108a and covers the opening 122p.

Figure 2D:
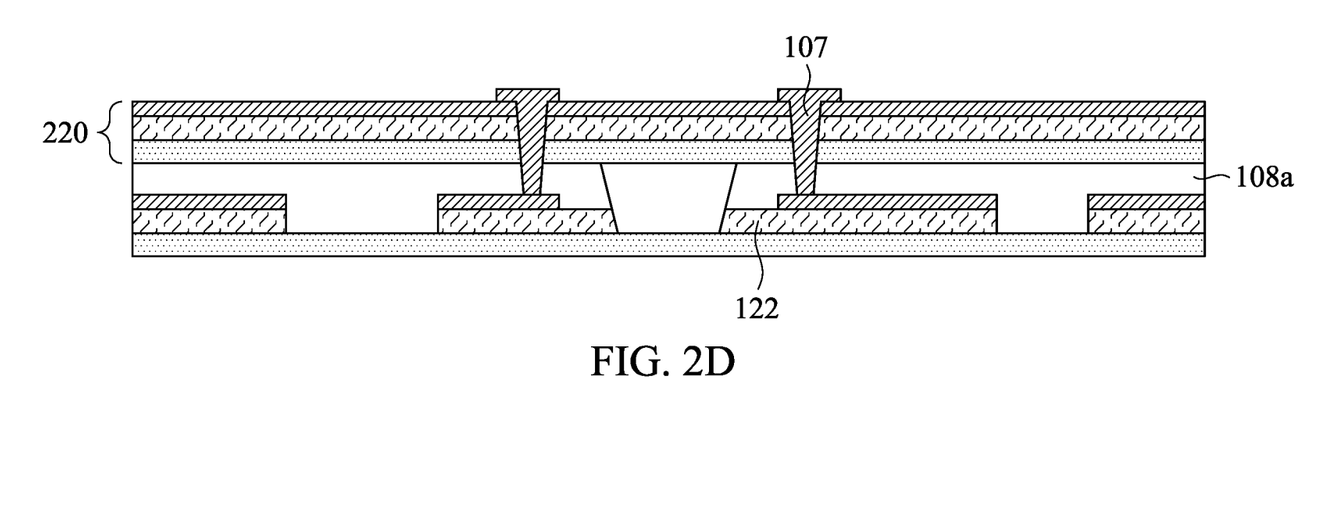
Figure 2E:
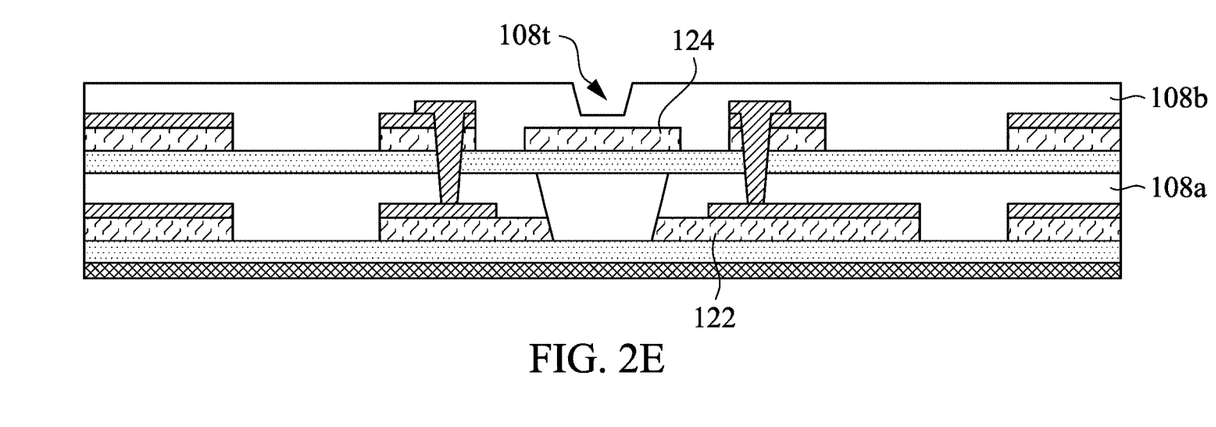

Referring to FIG. 2D, the plurality of conductive blind vias 107 are formed on the second substrate 220 by such as electroplating, so that the first resistive layer 122 on the first substrate 210 is electrically connected to the second substrate 220 through these plurality of conductive blind vias 107. Afterwards, as shown in FIG. 2E, the second substrate 220 is patterned to form the second resistive layer 124 by lithography and etching. The second resistive layer 124 overlaps the first resistive layer 122 and is not electrically connected to the first resistive layer 122. After the second resistive layer 124 is formed, the insulation material 108b including the trench 108t is disposed on the second resistive layer 124.

Figure 2F:
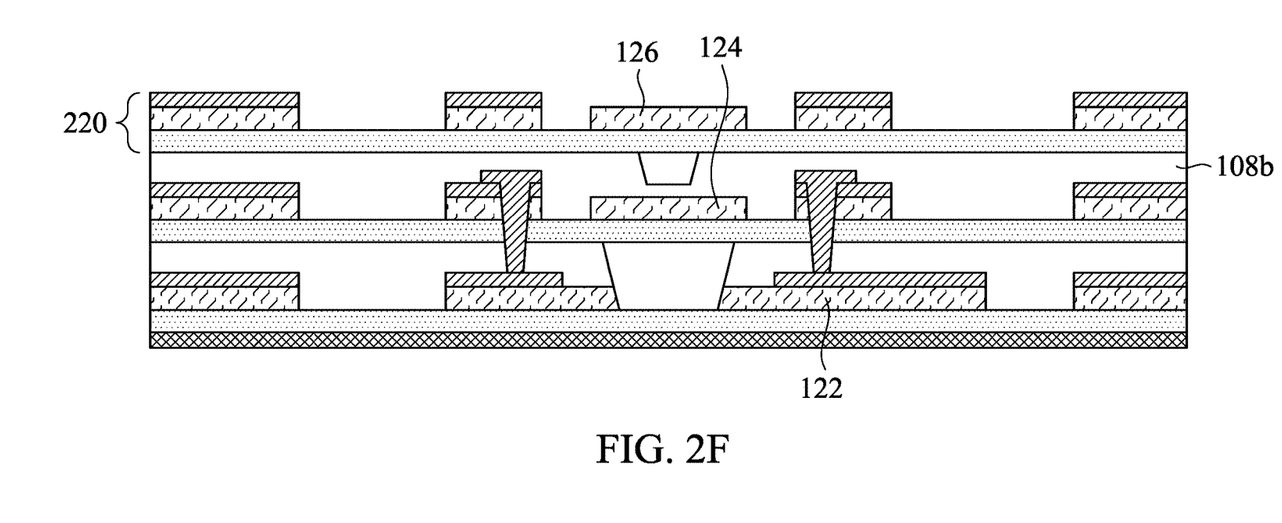
Figure 2G:
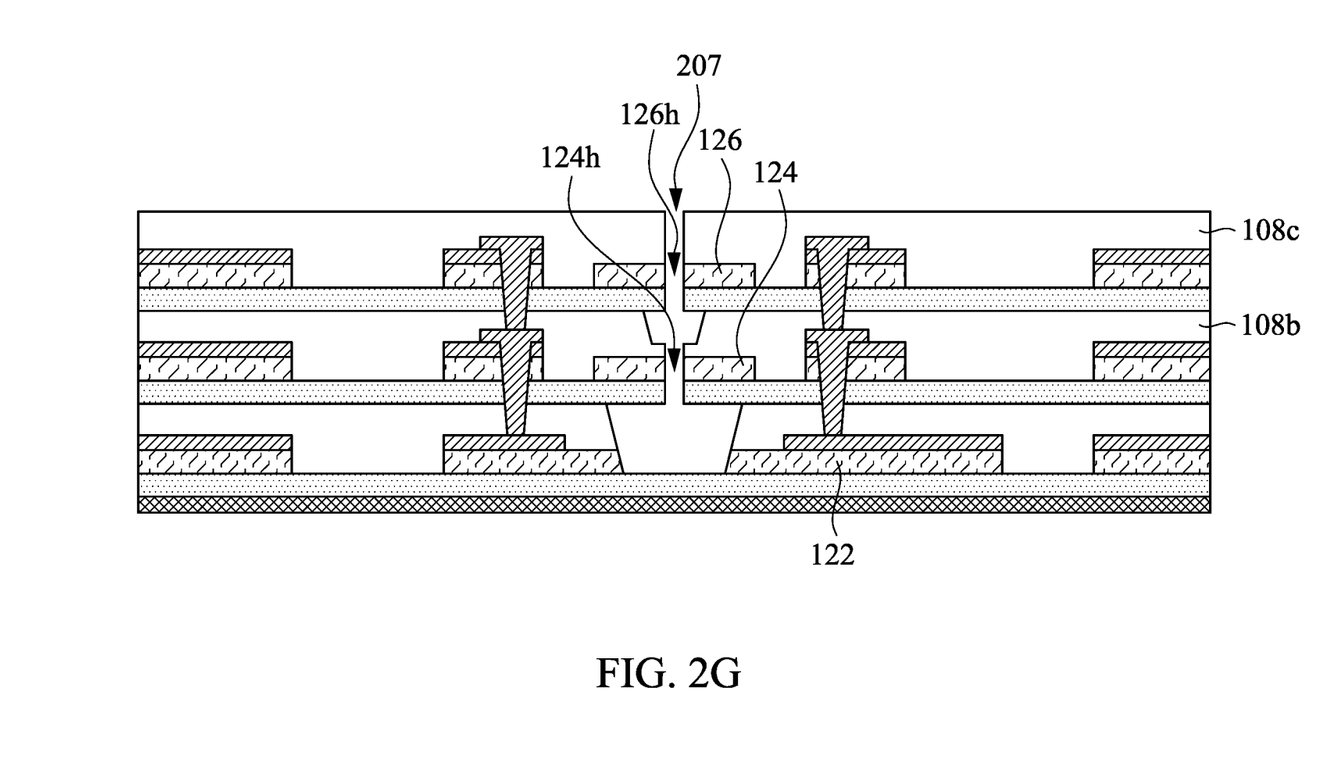

Referring to FIG. 2F, the third substrate 230 is disposed on the insulation material 108b and is patterned to form the third resistive layer 126. As shown in FIG. 2G, the insulation material 108c is disposed on the third substrate 230, so that the insulation material 108c covers the third resistive layer 126. Afterwards, a part of the second resistive layer 124 and a part of the third resistive layer 126 are removed by such as ablative laser, so that the hole 124h and the hole 126h are formed. Furthermore, a part of the insulation material 108b and a part of the insulation material 108c are removed, so that the hole 124h and the hole 126h are extended. As a result, the trench 207 is formed, and two opposite sides of the trench 207 connecting the first resistive layer 122, the second resistive layer 124 and the third resistive layer 126.

Figure 2H:
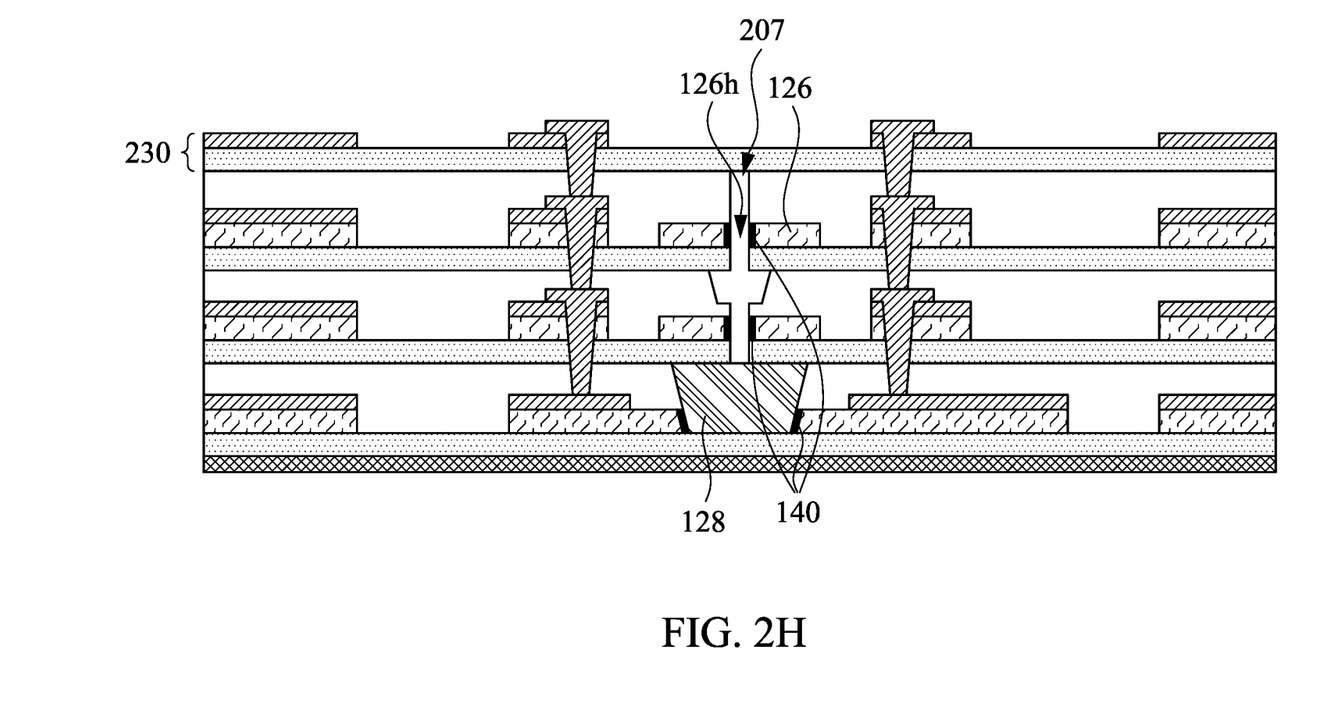

Referring to FIG. 2H, after the trench 207 is formed, the protecting layer 140 is formed on partial inner wall (not denoted) of the trench 207 by surface treatments such as electroplating, electroless plating or sputtering. Afterwards, the liquid metal material 128 is disposed in the trench 207 and is electrically connected to the first resistive layer 122. After the liquid metal material 128 is disposed, the third substrate 230 is disposed on the insulation material 108c. The third substrate 230 covers one end of the hole 126h of the third resistive layer 126, so that the liquid metal material 128 is sealed in the trench 207.

It is worth mentioning, the first substrate 210, the second substrate 220 and the third substrate 230 may separately include the insulation layer 211, the resistive material layer 213 and the metal layer 215 (denoted in FIG. 2A), and the insulation layer 211 and the metal layer 215 are separately located on two opposite sides of the resistive material layer 213. The insulation layer 211 may include insulation materials such as polyimide (PI), while the resistive material layer 213 may include metal alloy materials such as nickel-phosphorus (NiP) alloy, nickel chromium (NiCr) alloy or similarity thereof, while the metal layer 215 may include copper.

In conclusion, the resistive layers of the variable resistive region can be electrically connected to or disconnected to each other through the volume change of the liquid metal material under different temperatures, so as to control the resistance of the variable resistive region. Therefore, the circuit board with embedded resistors is equipped with the function of varying resistances, thereby broadening the application of the circuit board with embedded resistors.

Although the embodiments of the present disclosure have been disclosed as above in the embodiments, they are not intended to limit the embodiments of the present disclosure. Any person having ordinary skill in the art can make various changes and modifications without departing from the spirit and the scope of the embodiments of the present disclosure. Therefore, the protection scope of the embodiments of the present disclosure should be determined according to the scope of the appended claims.

What is claimed is:
1. A circuit board, comprising:
a circuit substrate; and
a variable resistive region, located in the circuit substrate, and the variable resistive region comprises:

a first resistive layer, electrically connected to the circuit substrate;

a second resistive layer, located on and overlapping the first resistive layer; and a liquid metal material, distributed on and electrically connected to the first resistive layer;

wherein when the liquid metal material is under an initial temperature, the liquid metal material is spaced from the second resistive layer, and the liquid metal material is not electrically connected to the second resistive layer;

wherein when the liquid metal material is under a first temperature higher than the initial temperature, the liquid metal material touches the second resistive layer, and the liquid metal material is electrically connected to the second resistive layer.

2. The circuit board of claim 1, wherein the second resistive layer further comprising:

a hole, connecting two opposite sides of the second resistive layer;

wherein when the liquid metal material is under the first temperature, the liquid metal material extends to the hole and is connected to the second resistive layer through a side wall of the hole.

3. The circuit board of claim 2, wherein the variable resistive region further comprising:

a third resistive layer, overlapping the second resistive layer, wherein the second resistive layer is located between the first resistive layer and the third resistive layer;

wherein when the liquid metal material is under a second temperature higher than the first temperature, the liquid metal material extends to and is electrically connected to the third resistive layer through the hole.

4. The circuit board of claim 3, wherein the circuit substrate comprising:

three circuit layers, wherein the circuit layers are separately located on the first resistive layer, the second resistive layer and the third resistive layer;

a pad layer, wherein two of the circuit layers are located between the pad layer and the other one of the circuit layers; and a plurality of conductive blind vias, disposed between two adjacent circuit layers and disposed between one of the circuit layers and the pad layer, wherein the circuit layers and the pad layer are electrically connected to each other through the plurality of conductive blind vias.

5. The circuit board of claim 4, wherein the circuit substrate further comprising:

an insulation material, located between the second resistive layer and the third resistive layer, wherein the insulation material includes an opening, and the opening connects the hole with the third resistive layer.

6. The circuit board of claim 5, wherein when the liquid metal material is under the first temperature, a liquid surface of the liquid metal material is located between two opposite ends of the opening and is spaced from the third resistive layer.

7. The circuit board of claim 2, further comprising:

a protecting layer, located in the hole of the second resistive layer and covering an inner wall of the hole, wherein the second resistive layer is electrically connected to the protecting layer.

8. The circuit board of claim 1, wherein the liquid metal material includes gallium-base alloy.

9. The circuit board of claim 1, wherein a resistance of the first resistive layer is larger than a resistance of the second resistive layer.

10. The circuit board of claim 1, further comprising:

two covering layers, separately disposed on two opposite sides of the circuit substrate and covering the variable resistive region.

11. A method for fabricating a circuit board, comprising:

providing a first substrate;

patterning the first substrate to form a first resistive layer;

disposing a second substrate on the first substrate;

pattering the second substrate to form a second resistive layer;

removing a part of the first substrate and a part of the second substrate to form a trench, wherein the trench connects the first resistive layer with the second resistive layer; and disposing a liquid metal material, and the liquid metal material is electrically connected to the first resistive layer.

12. The method of claim 11, wherein patterning the first substrate to form the first resistive layer comprising:

forming an opening on the first resistive layer, wherein the second substrate covers the opening.

13. The method of claim 12, further comprising:

forming an insulation material on the first resistive layer, and the insulation material exposes the opening.

14. The method of claim 11, further comprising:

forming an insulation material on the second resistive layer; and disposing a third substrate on the insulation material, and the liquid metal material is sealed in the trench.

15. The method of claim 11, further comprising:

forming a protecting layer on a partial inner wall of the trench including metal materials, wherein the second resistive layer is electrically connected to the protecting layer.

* * * * *